United States Patent [19]

Anami et al.

[11] Patent Number: 4,772,930
[45] Date of Patent: Sep. 20, 1988

[54] COMPLEMENTARY METAL OXIDE SEMICONDUCTOR INTEGRATED CIRCUIT WITH UNEQUAL REFERENCE VOLTAGES

[75] Inventors: Kenji Anami; Masahiko Yoshimoto; Satoru Kamoto, all of Itami, Japan

[73] Assignee: Mitsubishi Denki Kabushiki Kaisha, Tokyo, Japan

[21] Appl. No.: 48,509

[22] Filed: May 4, 1987

Related U.S. Application Data

[63] Continuation of Ser. No. 719,055, Apr. 2, 1985, abandoned.

[30] Foreign Application Priority Data

Apr. 28, 1984 [JP] Japan ................................. 59-86875

[51] Int. Cl.⁴ .......................................... H01L 27/02
[52] U.S. Cl. ........................................ 357/42; 357/45; 357/23.6; 357/44
[58] Field of Search .................... 357/42, 45, 23.6, 44, 357/43

[56] References Cited

U.S. PATENT DOCUMENTS

| | | |
|---|---|---|
| 4,006,491 | 2/1977 | Alaspa et al. ........................ 357/42 |
| 4,011,581 | 3/1977 | Kubo et al. .......................... 357/42 |
| 4,012,762 | 3/1977 | Abe et al. ............................ 357/42 |
| 4,035,826 | 7/1977 | Morton et al. ....................... 357/42 |
| 4,063,274 | 12/1977 | Dingwall .............................. 357/42 |
| 4,100,561 | 7/1978 | Ollendorf ............................. 357/42 |
| 4,261,002 | 4/1981 | Roger .................................. 357/44 |
| 4,327,368 | 4/1982 | Uchioa ................................. 357/42 |
| 4,660,067 | 4/1987 | Ebina .................................. 357/42 |

FOREIGN PATENT DOCUMENTS

| | | |
|---|---|---|
| 0084000 | 7/1983 | European Pat. Off. . |
| 58-127348 | 7/1983 | Japan ................................... 357/42 |
| 1542481 | 3/1979 | United Kingdom . |
| 1559581 | 1/1980 | United Kingdom . |
| 1558502 | 1/1980 | United Kingdom . |
| 2158640 | 11/1985 | United Kingdom ............. 357/44 X |

OTHER PUBLICATIONS

Chen, "Latch-Up Elimination in High Density DMOS", *1983 VLSI Symposium Digest*, pp. 54–55.

Primary Examiner—Andrew J. James
Assistant Examiner—William A. Mintel
Attorney, Agent, or Firm—Lowe, Price, LeBlanc, Becker & Shur

[57] ABSTRACT

A power supply voltage to be applied to a metallic connection 36a is supplied through an n+ diffusion region 34a, an N type well 22, an n+ diffusion region 34c and a metallic connection 36C to a p+ diffusion region 23b serving as a power supply line. An n+ diffusion region 73 serving as a ground line is grounded through a metallic connection 76c, a p+ diffusion region 74c, a P type well 72, a p+ diffusion region 74b and a metallic connection 76b.

4 Claims, 3 Drawing Sheets

COMPLEMENTARY METAL OXIDE SEMICONDUCTOR INTEGRATED CIRCUIT WITH UNEQUAL REFERENCE VOLTAGES

This application is a continuation of application Ser. No. 719,055 filed Apr. 2, 1985 now abandoned.

BACKGROUND OF THE INVENTION

1. Field of the Invention

The present invention relates to a complementary metal oxide semiconductor integrated circuit (A complementary metal oxide semiconductor is hereinafter referred to as CMOS and an integrated circuit is hereinafter referred to as IC). Particularly, the present invention relates to a CMOS IC in which latch-up immunity for example is improved.

2. Description of the Prior Art

FIG. 1 is a plan view showing an example of a conventional CMOS static RAM (a random access memory). FIG. 2 is a cross-sectional view taken along the line II—II in FIG. 1. Referring to FIG. 1, a pair of N channel inverter transistors 11a and 11b, a pair of P channel load transistors 12a and 12b and a pair of N channel read-write access transistors 13a and 13b are formed in a memory cell shown by dotted lines. Accordingly, this memory cell is a 6-device static type memory cell. A word line 14 comprised of polysilicon, a power supply line 15 comprised of a p+ diffusion layer and a ground line 16 are connected to this memory cell. The word line 14 is connected to the gates of the transistors 13a and 13b. The drain regions 17a and 17b of the transistors 13a and 13b, respectively, are connected through a contact to a bit line of aluminum not shown. The power supply line 15 is connected to the drains of the transistors 12a and 12b.

Referring to FIG. 2, an N type well 22 is formed in a portion of a P type substrate 21. P+ diffusion regions 23a and 23b are formed on the surface of the N type well 22. The p+ diffusion region 23b forms the power supply line 15 shown in FIG. 1. N+ diffusion regions 24a and 24b are formed on the surfaces of other portions of the P type substrate 21. The n diffusion region 24a forms the drain region 17a of the transistor 13a and the n+ diffusion region 24b forms the source region 19a of the transistor 13a. On the surfaces of the P type substrate 21 and the N type well 22, separated oxide films 25a, 25b and 25c are formed in appropriate positions and polysilicon films 26a, 26b, 26c and 26d serving as gates or connections are also formed in appropriate positions. Gate oxide films 27a and 27b are formed under the polysilicon films 26a and 26b, respectively. The polysilicon film 26b forms the word line 14 shown in FIG. 1.

FIG. 3 is a view showing a laminated structure formed between a power supply terminal and a ground terminal in the CMOS IC shown in FIGS. 1 and 2. Referring to FIG. 3, on the surfaces of the P type substrate 21 and the N type well 22, separation oxide films 35a, 35b and 35c and metallic connections 36a and 36b of aluminum or the like are formed. The metallic connection 36a serves as a power supply terminal and a power supply voltage Vcc is applied to this metallic connection 36a. The metallic connection 36b serves as a ground terminal and is connected to the ground. The metallic connection 36a is connected to the n+ diffusion region 34a serving as a region for making contact to the N type well 22 as well as to the p+ diffusion region 23b forming the power line 15 shown in FIG. 1. The metallic connection 36b, on the other hand, is connected to the n+ diffusion region 34b forming the ground line 16 shown in FIG. 1.

As described above, the conventional CMOS IC has a laminated structure as shown in FIG. 3 and accordingly a parasitic circuit as shown in FIG. 4 exists between the power supply and the ground. Referring to FIG. 4, the transistor 41 is an npn type transistor structured by the N type well 22, the P type substrate 21 and the n+ diffusion region 34b shown in FIG. 3 and the transistor 42 is a pnp type transistor structured by the p+ diffusion region 23b, the N type well 22 and the P type substrate 21. A resistor 43 is a parasitic resistor in the N type well 22 and a resistor 44 is a parasitic resistor in the P type substrate 21. A power supply terminal 45 corresponds to the metallic connection 36a in FIG. 3 and a ground terminal 46 corresponds to the metallic connection 36b in FIG. 3.

Thus, in a conventional CMOS IC, a parasitic circuit as shown in FIG. 4 exists between the power supply and the ground, which causes problems as set forth in the following. When a negative electric noise is applied to the N type well 22 (the base of the transistor 42) or when a positive electric noise is applied to the P type substrate 21 (the base of the transistor 41), a forward bias state is established between the emitter and the base of the transistor 42 or 41 and both the transistors 41 and 42 are conducted, causing a so-called latch-up phenomenon, namely, lowering of the potential of the power supply terminal 45. The circuit shown in FIG. 4 is in a structure in which conduction of the transistor 42 provokes conduction of the transistor 41 and vice versa.

In order to dissolve the above described problems, a method for improving latch-up immunity by improvement of a process technology of an IC has been proposed, as can be seen in "Latch-up Elimination in High Density CMOS" in page 54 of 1983 VLSI Symposium Digest. In this proposed method, however, parasitism of a circuit between the power supply and the ground as shown in FIG. 4 cannot be avoided and when a noise voltage becomes high, latch-up occurs unfavorably.

SUMMARY OF THE INVENTION

The present invention aims to provide a CMOS integrated circuit having extremely high immunity to latch-up.

Briefly stated, in the present invention, a reference voltage is applied through at least a well to the diffusion regions formed in the well as a power supply line and a ground line for example, without being directly applied thereto.

According to the present invention, a reverse bias state can always be maintained between the emitter and the base of a parasitic transistor and as a result, even if a noise voltage of high level is applied, occurrence of latch-up can be prevented almost completely. Accordingly, a CMOS IC of extremely high reliability can be obtained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
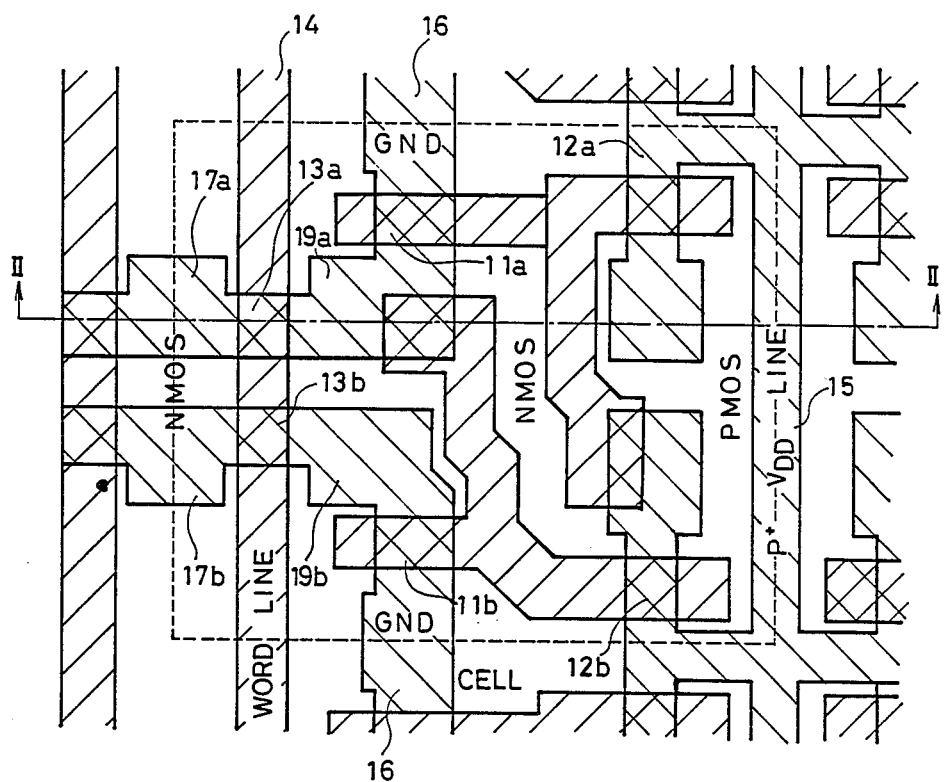
FIG. 1 is a plane view of a memory cell of a conventional CMOS static RAM.
Figure 2:
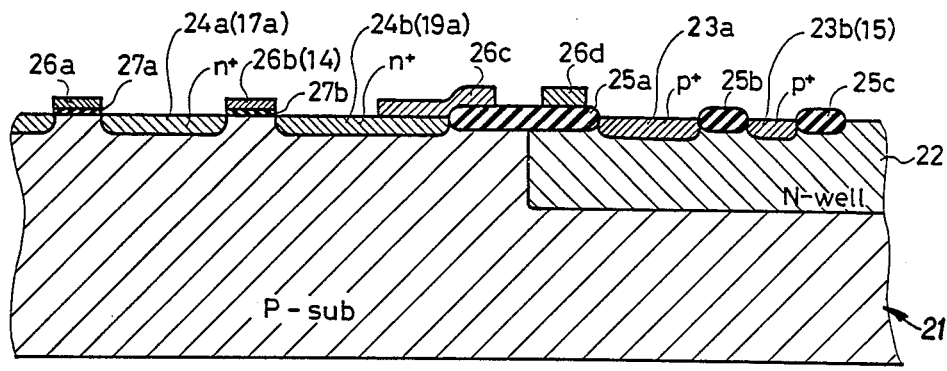
FIG. 2 is a cross-sectional view taken along the line II—II in FIG. 1.
Figure 3:
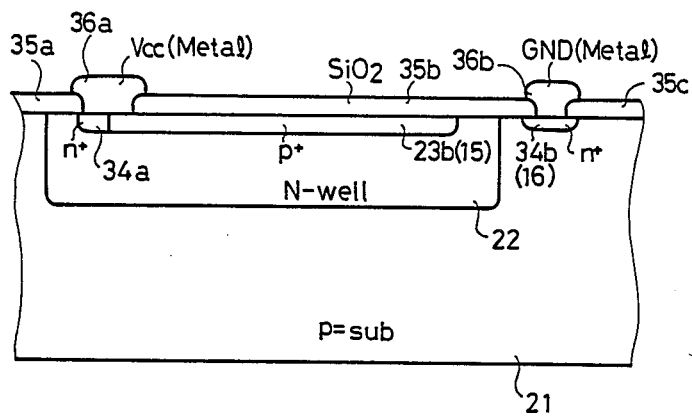
FIG. 3 is a view showing a laminated structure formed between a power supply terminal and a ground terminal in the CMOS IC shown in FIGS. 1 and 2.
Figure 4:
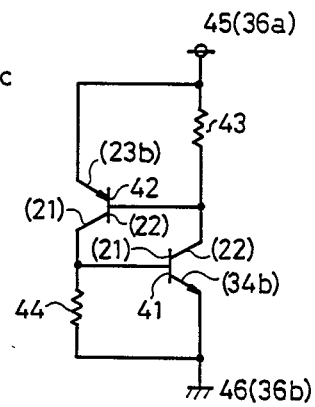
FIG. 4 is an equivalent circuit diagram of the laminated structure shown in FIG. 3.
Figure 5:
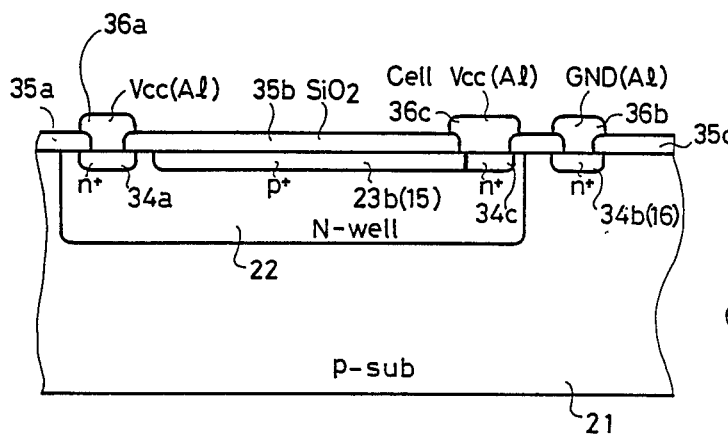
FIG. 5 is a view of an embodiment of the present invention, showing a laminated structure formed between a power supply terminal and a ground terminal.

FIG. 5 is a view of an embodiment of the present invention, showing a laminated structure formed between a power supply terminal and a ground terminal. In a CMOS IC of this embodiment, in the same manner as in the CMOS IC shown in FIGS. 1 and 2, an NMOS transistor is formed in a P type substrate and a PMOS transistor is formed in an N type well so that the NMOS and PMOS transistors operate in the state where the P type substrate is biased to the ground and the N type well is biased to a power supply. This embodiment in FIG. 5 has the same structure as that of the conventional example shown in FIG. 3, except for the below described points, and therefore the portions identical or corresponding to those of the conventional example in FIG. 3 are designated by the identical reference numerals, description thereof being omitted. The essential feature of the embodiment in FIG. 5 is that a metallic connection 36a serving as a power supply terminal is not connected directly to a p+ diffusion region 23b forming a power supply line and electric power is supplied to the p+ diffusion region 23b through an N type well 22. More specifically, in this embodiment, an n+ diffusion region 34c is formed on the surface of the N type well in a portion separated from the portion where the metallic connection 36a is in contact with the N type well 22, and the n+ diffusion region 34c is connected to the p+ diffusion region 23b by means of the metallic connection 36c. The metallic connections 36a and 36c are electrically insulated from each other by means of a separation oxide film 35b. With the above described structure, a power supply voltage to be applied to the metallic connection 36a is transmitted through the n+ diffusion region 34a, the N type well 22, the n+ diffusion region 34c and the metallic connection 36c so as to be supplied to the p+ diffusion region 23b.

Figure 6:
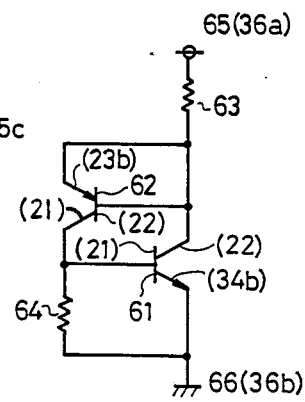
FIG. 6 is an equivalent circuit diagram of the laminated structure shown in FIG. 5.

FIG. 6 is an equivalent circuit diagram of the laminated structure shown in FIG. 5. Referring to FIG. 6, the transistor 61 is an npn type transistor structured by the N type well 22, the P type substrate 21 and the n+ diffusion region 34b, and the transistor 62 is a pnp type transistor structured by the p+ diffusion region 23b, the N type well 22 and the P type substrate 21. The resistor 63 is a parasitic resistor in the N type well 22 and the resistor 64 is a parasitic resistor in the substrate 21. The power supply terminal 65 corresponds to the metallic connection 36a in FIG. 5 and the ground terminal 66 corresponds to the metallic connection 36b in FIG. 5.

As can be seen from FIGS. 5 and 6, the emitter potential of the transistor 62 is always lower than the base potential equal to the potential of the N type well 22 since the emitter potential of the transistor 62 is supplied through the N type well 22. Accordingly, if an electric noise is applied to the base of the transistor 41 or 42, a forward bias state will never be established between the emitter and the base of the transistor 62 and latch-up phenomenon will never occur.

If the n+ diffusion region 34a serving as a power supply input of the N type well 22 is disposed too closely to the n+ diffusion region 34c serving as a power output from the N type well 22, the potential of the p+ diffusion region 23b might be partially larger than the potential of the N type well 22. Accordingly, the n+ diffusion regions 34a and 34c are preferably separated from each other as far as possible. For example, as in the embodiment in FIG. 5, the n+ diffusion regions 34a and 34c are disposed nearly at both ends of the N type well 22, so that a forward bias can be almost perfectly prevented from being applied between the emitter and the base of the transistor 2 and thus latch-up can be avoided almost completely.

Figure 7:
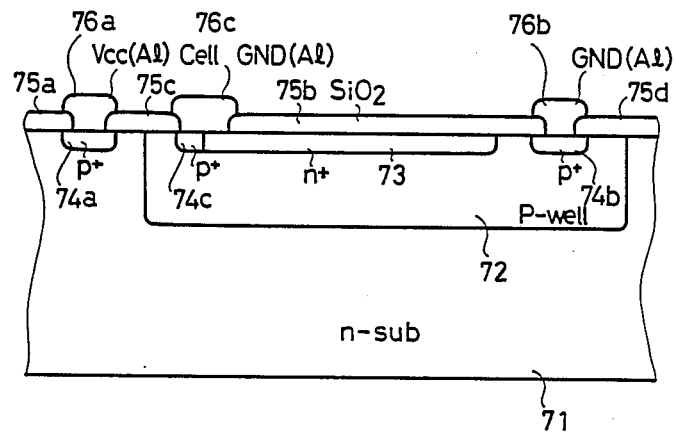
FIG. 7 is a view of another embodiment of the present invention, showing a laminated structure formed between a power supply terminal and a ground terminal.

In the embodiment shown in FIGS. 5 and 7, a CMOS IC of an N type well structure using a P type substrate was employed. However, the present invention can also be applied to a CMOS IC of a P type well structure using an N type substrate.

FIG. 7 is a view showing a laminated structure of another embodiment of the present invention. In a CMOS IC of this embodiment, a PMOS transistor is formed in an N type substrate and an NMOS transistor is formed in a P type well so that the PMOS and NMOS transistors operate in the state where the N type substrate is biased to the power supply line and the P type well is biased to the ground. Referring to FIG. 7, in a portion of the N type substrate 71, a P type well 72 is formed. In the P type well 72, a p+ diffusion region 74b for making contact between the ground and the P type well 72, an n+ diffusion region 73 serving as a ground line and a p+ diffusion region 74c serving as an output for taking out the potential of the P type well 72 are formed. In other portions of the N type substrate 71, a p+ diffusion region 74a for making a power supply line. Metallic connections 76a, 76b and 76c are formed on the surfaces of the N type substate 71 and the P type well 72. The metallic connection 76a serves as a power supply terminal and is in contact with the p+ diffusion region 74a, a power supply voltage Vcc being applied to this metallic connection 76a from the power supply not shown. The metallic connection 76b serving as a ground terminal is connected to the ground and is in contact with the p+ diffusion region 74b. The metallic connection 76c is in contact with both the p+ diffusion region 74c and the n+ diffusion region 73. The metallic connections 76a, 76b and 76c are electrically insulated from each other by separation oxide films 75a to 75d. The essential feature of the embodiment in FIG. 7 is that the metallic connection 76b serving as the ground terminal to the n+ diffusion region 73 forming the ground line is not connected directly. More specifically, the n+ diffusion region 73 is connected to the ground through the metallic connection 76c, the p+ diffusion region 74c, the P type well 72, the p+ diffusion region 74b and the metallic connection 76b.

Figure 8:
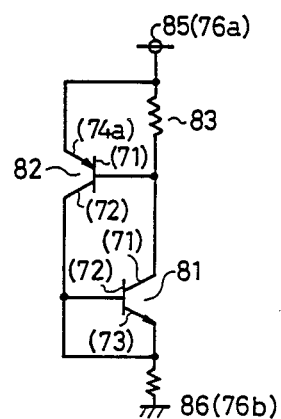
FIG. 8 is an equivalent circuit diagram of the laminated structure shown in FIG. 7.

FIG. 8 is an equivalent circuit diagram of the laminated structure shown in FIG. 7. Referring to FIG. 8, the transistor 81 is an npn type transistor structured by the N type substrate 71, the P type well 72 and the n+ diffusion region 73, and the transistor 82 is a pnp type transistor structured by the p+ diffusion region 74a, the N type substrate 71 and the P type well 72. The resistor 83 is a parasitic resistor in the N type substrate 71. The power supply terminal 84 corresponds to the metallic connection 76a and the ground terminal 86 corresponds to the metallic connection 76b.

As can be seen from FIGS. 7 and 8, the emitter of the transistor 81 is grounded through the P type well 72 and accordingly the potential of this emitter is always higher than the potential of the base equal to the potential of the P type well 72. Consequently, even if an electric noise is applied to the base of the transistor 81 or 82, a forward bias will never be applied between the emitter and the base of the transistor 81 and accordingly the transistor 81 will never be conducted and there will be no possibility of latch-up.

In the above described embodiments, the response speed of the circuit devices might be slackened since a resistor is interposed in the power supply or the ground. However, if the embodiments are applied to a portion where power consumption is very small, such as a memory cell of a CMOS RAM, the immunity to latch-up can be improved without deteriorating the speed performance as a whole.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A complementary metal oxide semiconductor integrated circuit having a power supply comprising:
    a semiconductor substrate of a first conductivity type forming the collector of a first transistor and the base of a second transistor.
    a well of a second conductivity type formed in said semiconductor substrate and defining the base of the first transistor and the collector of the second transistor, said second conductivity type being opposite to said first conductivity type,
    a first diffusion region of said second conductivity type formed in said well, a first reference voltage being applied to said first diffusion region,
    a second diffusion region of said first conductivity type and defining the emitter of said first transistor formed in said well,
    a third diffusion region of said second conductivity type defining a power supply terminal formed in said well and separated from said first diffusion region, and
    a fourth diffusion region of said second conductivity type formed in said semiconductor substrate, spaced laterally apart from said well and forming the emitter of said second transistor, a second reference voltage different from said first reference voltage being applied to said fourth diffusion region,
    said second diffusion region and said third diffusion region being in contact with each other within said well, a metallic layer of said substrate above said well electrically connecting said second and third diffusion regions to each other.

2. A complementary metal oxide semiconductor integrated circuit in accordance with claim 1, wherein
    said first conductivity type is a P type,
    said second conductivity type is an n type, and
    said first reference voltage is selected to be higher than said second reference voltage.

3. A complementary metal oxide semiconductor integrated circuit in accordance with claim 1, wherein
    said first conductivity type is an N type,
    said second conductivity type is a P type, and
    said first reference voltage is selected to be lower than said second reference voltage.

4. A complementary metal oxide semiconductor integrated circuit in accordance with claim 1, wherein
    said first diffusion region is formed in the vicinity of one end of said well, and
    said third diffusion region is formed in the vicinity of the other end of said well.

* * * * *